United States Patent
Ramaswamy

(10) Patent No.: US 8,791,553 B2
(45) Date of Patent: Jul. 29, 2014

(54) MULTILAYER SELECT DEVICES AND METHODS RELATED THERETO

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/941,129

(22) Filed: Jul. 12, 2013

(65) Prior Publication Data

US 2013/0292674 A1 Nov. 7, 2013

Related U.S. Application Data

(63) Continuation of application No. 13/620,886, filed on Sep. 15, 2012, now Pat. No. 8,487,414, which is a continuation of application No. 13/083,350, filed on Apr. 8, 2011, now Pat. No. 8,318,550.

(51) Int. Cl.
 *H01L 31/075* (2012.01)
(52) U.S. Cl.
 USPC .......................................... 257/656; 257/655
(58) Field of Classification Search
 USPC ............. 257/655, 656, 657; 438/46, 47, 134, 438/237, 328
 See application file for complete search history.

(56) References Cited

U.S. PATENT DOCUMENTS

| | | |
|---|---|---|
| 5,756,375 A | 5/1998 | Celii et al. |
| 6,388,272 B1 | 5/2002 | Odekirk |
| 6,989,553 B2 | 1/2006 | Yokogawa et al. |
| 7,011,737 B2 | 3/2006 | Varghese et al. |
| 7,091,579 B2 | 8/2006 | Nemoto |
| 7,196,383 B2 | 3/2007 | Joshi et al. |
| 7,667,277 B2 | 2/2010 | Callegari et al. |
| 7,679,160 B2 | 3/2010 | Udrea et al. |
| 7,816,727 B2 | 10/2010 | Lai et al. |
| 8,318,550 B2 | 11/2012 | Ramaswamy |
| 8,384,198 B2 | 2/2013 | Yasutake |
| 8,487,414 B2 * | 7/2013 | Ramaswamy ................ 257/656 |
| 2005/0063865 A1 | 3/2005 | Bonne et al. |
| 2006/0292394 A1 | 12/2006 | Iwaki et al. |
| 2010/0135061 A1 | 6/2010 | Li et al. |
| 2012/0256295 A1 | 10/2012 | Ramaswamy |
| 2013/0009281 A1 | 1/2013 | Ramaswamy |

* cited by examiner

*Primary Examiner* — Kevin M Picardat
(74) *Attorney, Agent, or Firm* — Schwegman, Lundberg & Woessner, P.A.

(57) ABSTRACT

Methods of forming and tuning a multilayer select device are provided, along with apparatus and systems which include them. As is broadly disclosed in the specification, one such method can include forming a first region having a first conductivity type; forming a second region having a second conductivity type and located adjacent to the first region; and forming a third region having the first conductivity type and located adjacent to the second region and, such that the first, second and third regions form a structure located between a first electrode and a second electrode, wherein each of the regions have a thickness configured to achieve a current density in a range from about $1 \times e^4$ amps/cm$^2$ up to about $1 \times e^8$ amps/cm$^2$ when a voltage in a selected voltage range is applied between the first electrode and the second electrode.

21 Claims, 3 Drawing Sheets

MULTILAYER SELECT DEVICES AND METHODS RELATED THERETO

CLAIM OF PRIORITY

This application is continuation of U.S. application Ser. No. 13/620,866, filed on 15 Sep. 2012, which is a divisional of U.S. application Ser. No. 13/083,350, filed on 8 Apr. 2011, now issued as U.S. Pat. No. 8,318,550, all of which are incorporated herein by reference in their entirety.

BACKGROUND

Select devices are utilized in integrated circuitry for selectively accessing components of the circuitry. Numerous device types may be utilized for select devices of integrated circuitry, such as diodes and transistors

BRIEF DESCRIPTION OF THE DRAWINGS

Some embodiments are illustrated by way of example and not limitation in the figures of the accompanying drawings in which.

DETAILED DESCRIPTION

Figure 1:
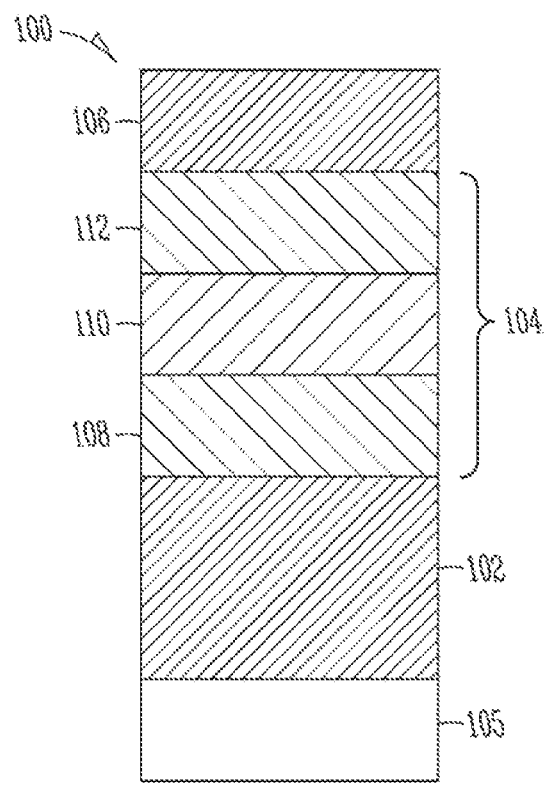
FIG. 1 is a cross-sectional view of a portion of a select device according to various embodiments of the invention.

In the following description, for purposes of explanation, numerous examples having example-specific details are set forth to provide an understanding of example embodiments.

Embodiments of example structures and methods of fabricating a select device, such as a bipolar select device, are described. A select device may be, for example, a semiconductor diode comprising a two-terminal element displaying asymmetric (rectifying) or symmetric current-voltage characteristics. A semiconductor diode includes built-in potential barrier heights which are dependent on the applied voltage (bias). In one embodiment, the select device has a potential barrier at the p-n junctions. In one embodiment, the select device does not include a photodiode, which is capable of converting light into current or voltage, depending on the mode of operation, and can further have a p-i-n junction.

In one embodiment, the select device is used in one or more memory arrays, such as one or more cross point arrays, and is capable of being tuned over a wide range of voltages using a select device structure (such as a structure located between two electrodes) of varying thicknesses. Tuning refers to adjusting the relationship between the applied voltage (V) and the resulting current (I), i.e., the slope of the I-V curve via structural design implemented in fabrication. The thicknesses described herein, however, are sufficiently low (less than about 700 Angstroms down to about 30 Angstroms) to allow higher current densities, such as greater than 1×e$^4$ amps/cm$^2$ to be achieved, as compared with conventional low temperature (<500° C.) select device structures having structure thicknesses greater than about 700 Angstroms. Such devices are useful in various cell technologies. In various embodiments, the select devices are configured for use in select memory cells for a read/write/erase operation.

Embodiments described herein provide a select device for use in a cross point array which can not only be tuned to restrict current flow at low voltages (greater than zero (0) up to about one (3) volt (V)), but can also allow a higher current to pass through them at higher voltages, such as greater than three (3) V, such as four (4) V or higher, such as up to about six (6) V, including any range there between. The select devices described herein are capable of sustaining a current density higher than 1×e$^4$ amps/cm$^2$, such as about 1×e$^6$ amps/cm$^2$ up to about 1×e$^8$ amps/cm$^2$. In one embodiment, the current density is greater than about 1×e$^4$ amps/cm$^2$ up to at least about 1×e$^8$ amps/cm$^2$.

FIG. 1 shows an example select device construction 100. The select device construction 100 may be supported by a semiconductor wafer, and, accordingly, may be a semiconductor construction. The select device construction 100 comprises a first electrode 102, a second electrode 106, and a structure 104 sandwiched between the first electrode 102 and the second electrode 106. The first electrode 102 is located on a base 105 comprised of any suitable material, such as a semiconductor material, quartz or other material configured for a particular application. In one embodiment, the select device construction 100 is a non-photo select device embedded or located in an integrated circuit such that light from an external source does not impinge upon the structure 104.

The structure 104 can be a p-n-p structure or a n-p-n structure. In one embodiment, the structure 104 has a thickness and can include a first n-doped region 108, a p-doped region 110 and a second n-doped region 112. In one embodiment, the p-doped region 110 is less than the thickness of both the first and second n-doped regions or both. In one embodiment, the thickness of the p-doped region 110 is decreased relative to one or both of the first and second n-doped regions, 108 and 112, respectively, which can improve the I-V slope while lowering low field leakage. In one embodiment, a decreased thickness of the p-doped region, relative to one or both of the first and second n-doped regions enhances a drain-induced barrier lowering (DIBL)-like effect.

In one embodiment, the structure 104 is a nanocrystalline material or partially amorphous material. In one embodiment, the structure 104 is epitaxial silicon comprising doped single-crystal silicon.

In one embodiment, the first and second n-doped regions, 108 and 112, respectively, are first and second n-doped silicon regions. In one embodiment, the first and second n-doped silicon regions are doped with about 1×e$^{15}$ cm$^{-3}$ to about 1×e$^{20}$ cm$^{-3}$ of phosphorous. In one embodiment, the p-doped region 110 is a p-doped silicon region. In one embodiment, the p-doped silicon region is doped with about 1×e$^{15}$ cm$^{-3}$ to about 1×e$^{20}$ cm$^{-3}$ of boron.

In one embodiment, the structure 104 can include a first p-doped region 108, an n-doped region 110 and a second p-doped region 112.

In one embodiment at least one additional structure 104 is located between the first and second electrodes, 102 and 106, respectively. In one embodiment, the select device construction 100 comprises one or more select devices, such as one or more stackable bipolar select devices. In one embodiment, the select device construction 100 can be used in conjunction with a transistor which can include at least one pair of stackable diodes.

The first electrode 102 can be comprised of a variety of materials, including, but not limited to, any suitable composition or combination of compositions, and may, for example, comprise one or more of various conductive metals (e.g., tantalum, platinum, tungsten, aluminum, copper, gold, nickel, titanium, molybdenum, etc.), metal-containing compositions (e.g., metal nitride, metal silicide such as tungsten silicide or titanium silicide, etc.), and conductively-doped semiconductor materials such as conductively-doped silicon.

In one embodiment, the first electrode 102 comprises at least one distinct area comprising a compound selected from, but not limited to, $NiSi_x$, Ru, Si, TaN, Ti, TiN, Pt, W, TiSi, $WN_x$, $TaN_x$, $CoSi_x$, $WSi_x$ wherein x>0 and combinations thereof.

The second electrode 106 or gate can be comprised of a variety of materials, including, but not limited to, any suitable composition or combination of compositions, and may, for example, comprise one or more of various conductive metals (e.g., tantalum, platinum, tungsten, aluminum, copper, gold, nickel, titanium, molybdenum, etc.), metal-containing compositions (e.g., metal nitride, metal silicide such as tungsten silicide or titanium silicide, etc.), and conductively-doped semiconductor materials such as conductively-doped silicon.

In one embodiment, the second electrode 106 comprises $NiSi_x$, Ru, Si, TaN, Ti, TiN, Pt, W, TiSi, $WN_x$, $TaN_x$, $CoSi_x$, $WSi_x$ wherein x>0, and combinations thereof.

The first and second electrodes, 102 and 106, respectively, can be formed by deposition into a via or a trench. The via material may be SiO2 or SiN. The first and second electrodes, 102 and 106, respectively, can also be formed by subtractive formation enabled through dry or wet etching.

Further treatment of the first and second electrodes, 102 and 106, respectively, can include planarization such as chemical-mechanical planarization (CMP) that leaves the electrodes (102, 106) planar. In one embodiment, the first and second electrodes, 102 and 104, respectively, are polished flat. Additional treatments can be provided as is known in the art, such as dry etch or wet etch to expose the silicon and form a gate.

Referring again to FIG. 1, the select device construction 100 has a charge transport mechanism to allow electrons to move in one direction and holes to move in an opposite direction from the first electrode 102 through the structure 104 to the second electrode 106, or vice versa. Various types of charge transport mechanisms can be used, including, but not limited to, a tunneling mechanism, including a direct tunneling mechanism, Fowler Nordheim tunneling, or a trap assisted tunneling mechanism, as is known in the art. Accordingly, adjustment of the thickness of the structure 104, including adjustment of the thickness of one or more of the individual layers (108, 110 and 112) in the structure 104 allows current density of the semiconductor construction 100 to be modulated as electrons move from the first electrode 102 through the structure 104 to the second electrode 106 or vice versa.

The structure 104 can have any suitable thickness capable of achieving a current density of greater than about $1 \times e^4$ amps/cm². In contrast to conventional structures sandwiched between electrodes, in one embodiment, the structure 104 has a thickness of less than about 700 Angstroms, such as less than about 400 Angstroms, or less than about 300 Angstroms, such as less than about 200 Angstroms or lower, down to about 30 angstroms, including any range there between. Each of the regions (108, 110, 112) in the structure 104 can have any suitable thickness, such as between about 10 Angstroms and about 100 Angstroms, such as between about 10 Angstroms and about 50 Angstroms or higher, up to a total thickness of less than about 500 Angstroms as noted above. The particular thickness of each region (108, 110, 112) and the overall thickness of the structure 104 can vary depending on the particular application, amount of doping and desired current density. In one embodiment, each region (108, 110, 112) has substantially the same thickness. In one embodiment, at least two regions (108, 110, 112) have the same thickness. In one embodiment, each region (108, 110, 112) has a different thickness. The structure 104 can be deposited using any suitable method, including, but not limited to, atomic layer deposition (ALD), physical vapor deposition (PVD), chemical vapor deposition (CVD), pulsed layer deposition (PLD) and molecular beam epitaxy (MBE). The structure 104 can be deposited at any suitable temperature to allow formation of the desired thicknesses. In one embodiment, the structure 104 is deposited at a temperature which is sufficiently low to allow formation of nanocrystalline or amorphous materials, rather than polycrystalline materials, such as polysilicon. In one embodiment, the temperature is between about 300° C. and about 1000° C., including between about 350° C. and about 500° C.

The threshold voltage ($V_t$) for the structures having a "npn" configuration as described herein (e.g., 104 from FIG. 1) is defined as the voltage required at a current level of one (1) A/cm².

Figure 2:
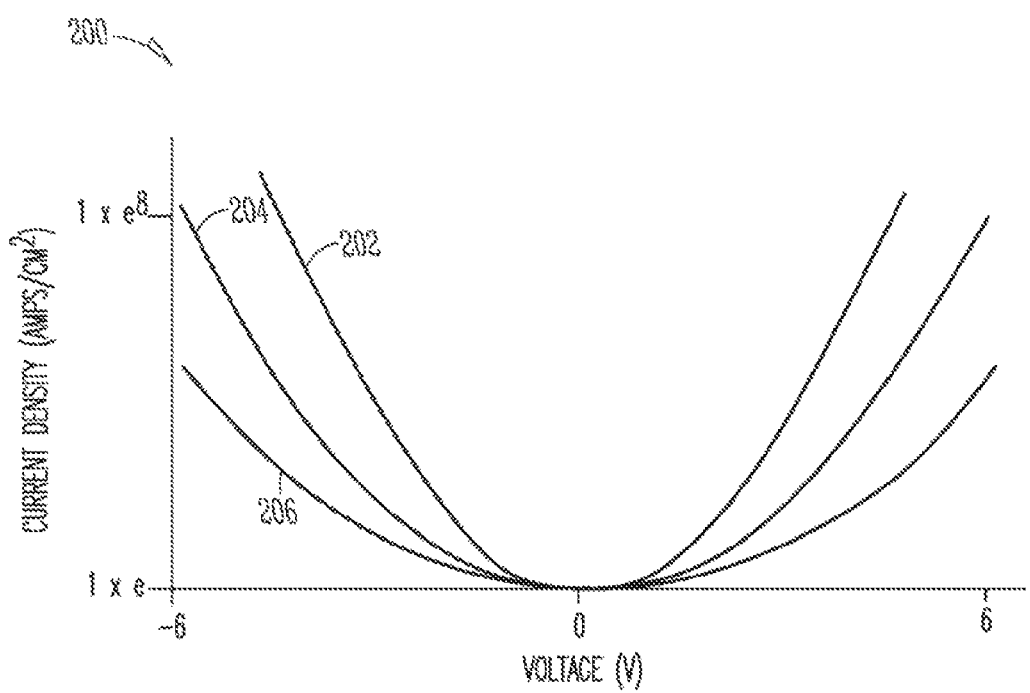
FIG. 2 shows current density (amps/cm$^2$) versus voltage (V) for various structure thicknesses according to various embodiments of the invention.

FIG. 2 shows current density (amps/cm²) versus voltage (V) for various structures 104. Curve 202 shows results for a structure wherein each region (108, 110 112) has a thickness of about 50 Angstroms. Curve 204 shows results for a structure wherein each region (108, 110 112) has a thickness of about 100 Angstroms. Curve 206 shows results for a structure wherein each region (108, 110 112) has a thickness of about 200 Angstroms. As can be seen, each of the curves (202, 204, 206) has similar threshold voltages of about zero (0) V, but different slopes.

In the embodiment shown in FIG. 2, the voltage (V) ranges from about −6 V to about 6 V over a current density of between about 1 amps/cm² to about $1 \times e^8$ amps/cm².

Figure 3:
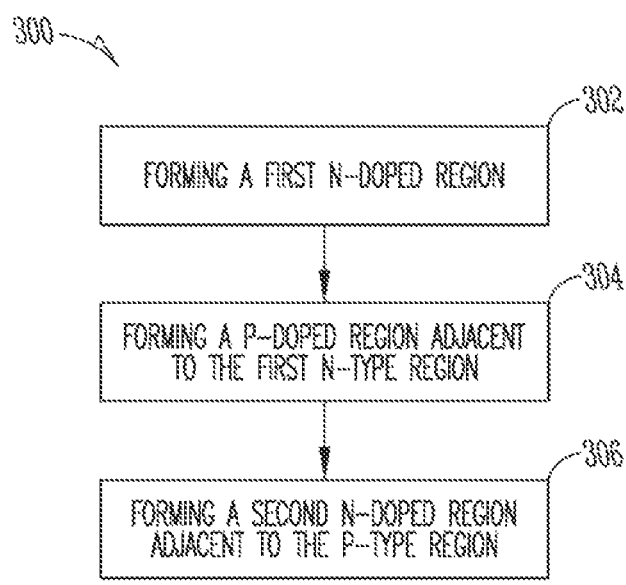
FIG. 3 is a flow diagram illustrating a method of forming a select device according to various embodiments of the invention.

FIG. 3 is a flow diagram of an example method 300 according to an embodiment. The method comprises forming a first n-doped region 302; forming a p-doped region adjacent to the first n-doped region 304; and forming a second n-doped region adjacent to the p-doped region 306, wherein the first n-doped region, the p-doped region, and the second n-doped region form a structure which is located between a first electrode and a second electrode, wherein each of the regions have a thickness configured to achieve a current density in a range from about $1 \times e^4$ amps/cm² up to about $1 \times e^8$ amps/cm² when a voltage is applied between the first electrode and the second electrode.

In other embodiments, the method comprises forming a first p-doped region, forming a n-doped region adjacent to the first p-doped region, and forming a second p-doped region, wherein the first p-doped region, the n-doped region, and the second p-doped region form a structure which is located between a first electrode and a second electrode, wherein each of the regions have a thickness configured to achieve a current density in a range from about $1 \times e^4$ amps/cm² up to about $1 \times e^8$ amps/cm² when a voltage is applied between the first electrode and the second electrode.

Various embodiments may have more or fewer steps than those shown in FIG. 3. In one embodiment, the first electrode, the second electrode and the structure comprise a select device. In one embodiment, the select device is a bipolar select device. The method can further comprise annealing the select device. The annealing can occur, for example, at a temperature of about 500° C. up to about 650° C. or higher, such as up to about 800° C. for a period of time, such as one (1) second up to about 20 seconds. In one embodiment, the method further comprises producing a stackable diode.

Figure 4:
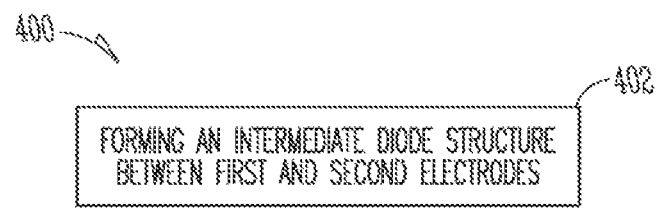
FIG. 4 is a flow diagram illustrating a method of tuning a select device according to various embodiments of the invention.

FIG. 4 is a flow diagram of an example method 400 according to an embodiment. The method comprises forming 402 a structure between first and second electrodes. Various embodiments may have more or fewer steps than those shown in FIG. 4. In one embodiment, the structure has a first n-doped silicon region, a p-doped silicon region adjacent to the first n-doped silicon region, and a second n-doped silicon region adjacent to the p-doped silicon region. In one embodiment, a thickness of each region is individually adjustable during fabrication to allow current density to be modulated as electrons, holes, or combinations thereof to move through the structure to the second electrode when a voltage is applied between the first electrode and the second electrode ranges from greater than zero (0) volts up to about four (4) volts.

In other embodiments, the structure has a first p-doped silicon region, a n-doped silicon region adjacent to the first p-doped silicon region, and a second p-doped silicon region adjacent to the n-doped silicon region.

In various embodiments, electrons and holes move in opposite directions through the structure via a tunneling mechanism. The structure can have, in various embodiments, a thickness of less than 500 Angstroms down to about 30 Angstroms, and a low field leakage of about one (1) amps/cm$^2$ to about 10 amps/cm$^2$. In one embodiment, the diode is configured by adjusting the thicknesses of the individual layers in the diode structure during fabrication to achieve a current density greater than about $1 \times e^4$ amps/cm$^2$ up to about $1 \times e^8$ amps/cm$^2$.

Figure 5:
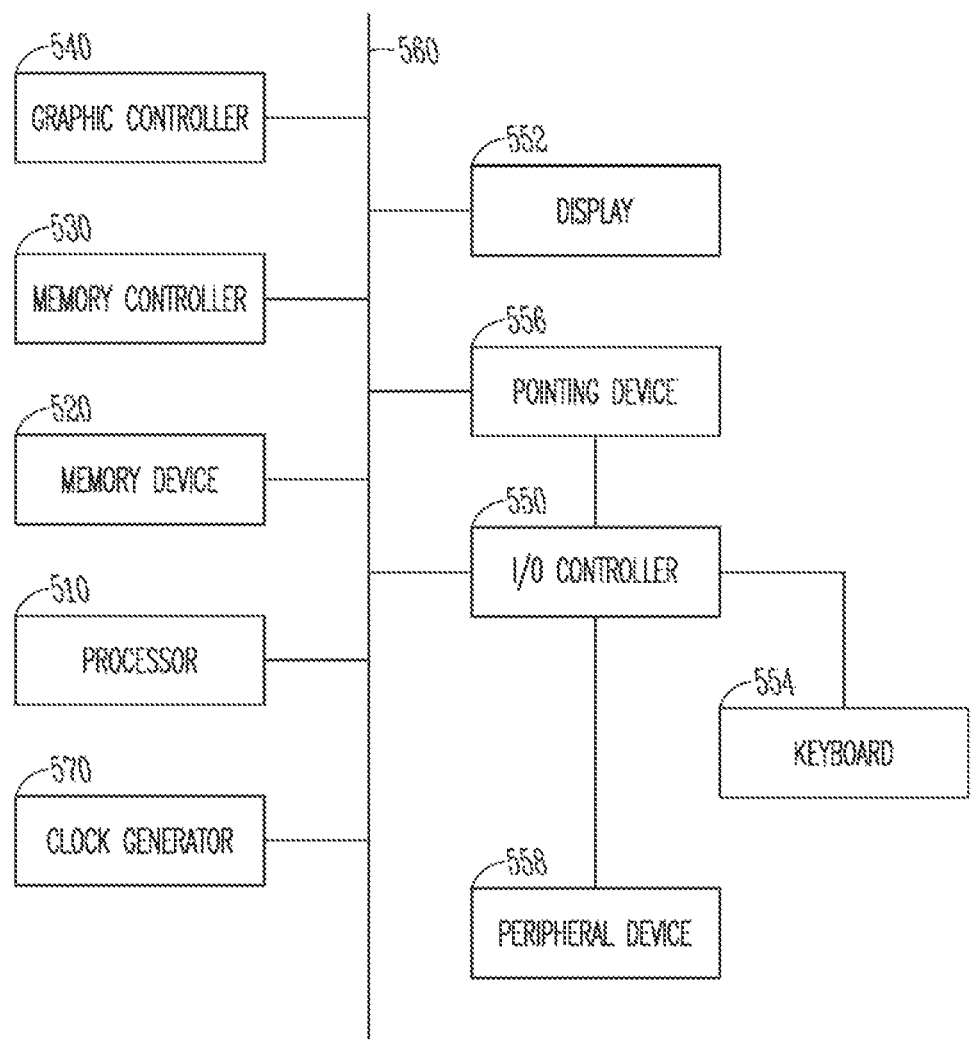
FIG. 5 is a diagram illustrating a system according to various embodiments of the invention.

FIG. 5 is a diagram illustrating a system 500 according to various embodiments of the invention. The system 500 may include a processor 510, a memory device 520, a memory controller 530, a graphic controller 540, an input and output (I/O) controller 550, a display 552, a keyboard 554, a pointing device 556, and a peripheral device 558. A bus 560 couples all of these devices together. A clock generator 550 is coupled to the bus 560 to provide a clock signal to at least one of the devices of the system 500 through the bus 560. The clock generator 550 may include an oscillator in a circuit board such as a motherboard. Two or more devices shown in system 500 may be formed in a single integrated circuit chip.

The memory device 520 may comprise a non-volatile memory including charge storage transistors described herein and shown in the figures according to various embodiments of the invention. The bus 560 may be interconnect traces on a circuit board or may be one or more cables. The bus 560 may couple the devices of the system 500 by wireless means such as by electromagnetic radiations, for example, radio waves. The peripheral device 558 coupled to the I/O controller 550 may be a printer, an optical device such as a CD-ROM and a DVD reader and writer, a magnetic device reader and writer such as a floppy disk driver, or an audio device such as a microphone.

The system 500 represented by FIG. 5 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any of the circuits or systems described herein may be referred to as a module. A module may comprise a circuit and/or firmware according to various embodiments.

Example structures and methods of fabricating select devices have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A device comprising:
a first electrode and second electrode;
a first region having a first conductivity type;
a second region having a second conductivity type and located adjacent to the first region; and
a third region having the first conductivity type and located adjacent to the second region, wherein the first, second and third regions form a structure located between the first electrode and the second electrode, wherein the first region contacts the first electrode, and the third region contacts the second electrode.

2. The device of claim 1, wherein the each of the first and third regions includes an n-doped region, and the second region includes p-doped region.

3. The device of claim 1, wherein the each of the first and third regions includes a p-doped region, and the second region includes an n-doped region.

4. The device of claim 1, wherein the first and third regions include single-crystal silicon.

5. The device of claim 1, wherein the first and third regions include amorphous silicon.

6. The device of claim 1, wherein the second region includes single-crystal silicon.

7. The device of claim 1, wherein the second region includes amorphous silicon.

8. The device of claim 1, further comprising at least one additional structure located between the first and second electrodes.

9. The device of claim 1, wherein a thickness of the second region is less than a thickness of the first region.

10. The device of claim 9, wherein a thickness of the second region is less than a thickness of the third region.

11. The device of claim 1, wherein each of the first, second, and third regions has a thickness in a range from about 20 Angstroms to about 50 Angstroms.

12. The device of claim 1, wherein at least one of the first and second electrodes comprises a compound selected from NiSi$_x$, Ru, Si, TaN, Ti, TiN, Pt, W, TiSi, WN$_x$, TaN$_x$, CoSi$_x$, WSi$_x$ and combinations thereof, wherein x is greater than zero.

13. The device of claim 1, further comprising a memory array, wherein the device is configured to select at least a portion of memory cells in the memory array in a read operation.

14. The device of claim 1, further comprising a memory array, wherein the device is configured to select at least a portion of memory cells in the memory array in a write operation.

15. The device of claim 1, further comprising a memory array, wherein the device is configured to select at least a portion of memory cells in the memory array in an erase operation.

16. The device of claim 1, further comprising a cross point memory array, wherein the device is configured to select at least a portion of memory cells in the cross point memory array in at least one of a read operation, a write operation, and an erase operation.

17. A method comprising:
   forming a first region having a first conductivity type;
   forming a second region having a second conductivity type and located adjacent to the first region; and
   forming a third region having the first conductivity type and located adjacent to the second region, wherein the first, second and third regions form a structure located between a first electrode and a second electrode, wherein the first region is formed such that the first region contacts the first electrode, and the third region is formed such that the third region contacts the second electrode.

18. The method of claim 17, wherein each of the first and third regions is doped with about $1 \times e^{15}$ cm$^{-3}$ to about $1 \times e^{20}$ cm$^{-3}$ of phosphorous, and the second region is doped with about $1 \times e^{15}$ cm$^{-3}$ to about $1 \times e^{20}$ cm$^{-3}$ of boron.

19. The method of claim 17, wherein each of the first, second, and third regions includes single-crystal silicon.

20. The method of claim 17, wherein each of the first, second, and third regions includes amorphous silicon.

21. The method of claim 17, wherein each of the first, second, and third regions has a thickness in a range from about 20 Angstroms to about 100 Angstroms.

* * * * *

UNITED STATES PATENT AND TRADEMARK OFFICE
CERTIFICATE OF CORRECTION

Page 1 of 1

PATENT NO. : 8,791,553 B2
APPLICATION NO. : 13/941129
DATED : July 29, 2014
INVENTOR(S) : Durai Vishak Nirmal Ramaswamy It is certified that error appears in the above-identified patent and that said Letters Patent is hereby corrected as shown below:

On the title page, item (63), under "Related U.S. Application Data", in column 1, line 3, delete "continuation" and insert -- division --, therefor.

Signed and Sealed this
Thirtieth Day of September, 2014

Michelle K. Lee
*Deputy Director of the United States Patent and Trademark Office*